(12) United States Patent
Burbano et al.

(10) Patent No.: US 9,735,787 B2
(45) Date of Patent: Aug. 15, 2017

(54) FREQUENCY SYNTHESIZER WITH DYNAMIC PHASE AND PULSE-WIDTH CONTROL

(71) Applicant: ANALOG DEVICES, INC., Norwood, MA (US)

(72) Inventors: Oscar Sebastian Burbano, Greensboro, NC (US); Matthew D. McShea, Summerfield, NC (US); Peter Derounian, Greensboro, NC (US); Reuben P. Nelson, Colfax, NC (US); Ziwei Zheng, Greensboro, NC (US); Brad P. Jeffries, Browns Summit, NC (US)

(73) Assignee: Analog Devices, Inc., Norwood, MA (US)

( * ) Notice: Subject to any disclaimer, the term of this patent is extended or adjusted under 35 U.S.C. 154(b) by 50 days.

(21) Appl. No.: 14/741,984

(22) Filed: Jun. 17, 2015

(65) Prior Publication Data

US 2016/0277030 A1 Sep. 22, 2016

Related U.S. Application Data

(60) Provisional application No. 62/135,061, filed on Mar. 18, 2015.

(51) Int. Cl.
*H03K 21/00* (2006.01)
*H03K 23/00* (2006.01)
(Continued)

(52) U.S. Cl.
CPC ............ *H03K 23/40* (2013.01); *G06F 1/022* (2013.01); *H03K 23/662* (2013.01); *H03K 21/00* (2013.01);
(Continued)

(58) Field of Classification Search
None
See application file for complete search history.

(56) References Cited

U.S. PATENT DOCUMENTS

| | | | | |
|---|---|---|---|---|
| 4,914,396 | A | * 4/1990 | Berthiaume | H03K 7/08 327/106 |
| 5,014,231 | A | * 5/1991 | Reinhardt | G06F 1/0328 327/107 |

(Continued)

OTHER PUBLICATIONS

Gentile, Ken; Direct Digital Synthesis (DDS) with a Programmable Modulus; AN-953 Application Note, Analog Devices, Rev. B, pp. 1-4 (no publication date provided—Applicant's representative respectfully requests that the Examiner treat the reference as prior art, but reserves the right to dispute the prior art status of the reference once additional information is learned).

*Primary Examiner* — Tuan T Lam
(74) *Attorney, Agent, or Firm* — Knobbe Martens Olson & Bear LLP

(57) ABSTRACT

An agile frequency synthesizer with dynamic phase and pulse-width control is disclosed. In one aspect, the frequency synthesizer includes a count circuit configured to modify a stored count value by an adjustment value. The frequency synthesizer also includes an output clock generator configured to generate an output clock signal having rising and falling edges that are based at least in part on the stored count value satisfying a count threshold. The count circuit is further configured to alter at least one of the period or phase of the output clock signal based at least in part on modifying an adjustment rate of the count circuit.

20 Claims, 8 Drawing Sheets

(51) Int. Cl.
*H03K 23/40* (2006.01)
*G06F 1/02* (2006.01)
H03K 23/66 (2006.01)
H03K 21/38 (2006.01)
H03K 23/58 (2006.01)

(52) U.S. Cl.
CPC ............. *H03K 21/38* (2013.01); *H03K 23/00* (2013.01); *H03K 23/58* (2013.01); *H03K 23/665* (2013.01)

(56) References Cited

U.S. PATENT DOCUMENTS

| | | | |
|---|---|---|---|
| 5,053,982 A | | 10/1991 | McCune, Jr. |
| 5,160,894 A | * | 11/1992 | Westwick ................. G06F 1/04 327/107 |
| 5,394,106 A | * | 2/1995 | Black ........................ H03L 7/16 327/107 |
| 5,459,418 A | * | 10/1995 | Uriya ...................... G06F 1/022 327/105 |
| 5,931,891 A | | 8/1999 | Landry |
| 6,121,816 A | | 9/2000 | Tonks et al. |
| 6,747,374 B2 | * | 6/2004 | Kouzuma ................ G04G 3/02 307/106 |
| 7,724,097 B2 | | 5/2010 | Carley et al. |
| 7,928,881 B1 | | 4/2011 | Baek et al. |
| 2005/0285582 A1 | * | 12/2005 | Azuma ................... H03K 7/08 323/282 |

* cited by examiner

FREQUENCY SYNTHESIZER WITH DYNAMIC PHASE AND PULSE-WIDTH CONTROL

BACKGROUND

Field

The described technology generally relates to a frequency synthesizer with dynamic phase and pulse-width control.

Description of the Related Art

Frequency synthesizers create an output waveform which can have various selectable properties. One type of frequency synthesizer is a direct digital synthesizer (DDS) which enables the dynamic adjustment of phase, pulse-width modulation, and pattern generation of the output waveform. DDSs can dynamically create an output waveform having properties that are user selectable from an input clock.

SUMMARY

In an embodiment, a frequency synthesizer comprises a count circuit configured to adjust a stored count value by an adjustment value based at least in part on an input clock signal and adjust the stored count value to a reset value based at least in part on the stored count value satisfying a count threshold, wherein the reset value corresponds to a difference between the stored count value and the count threshold in response to the stored count value satisfying the count threshold; and an output clock generator configured to generate an output clock signal having rising and falling edges that are based at least in part on the reset value, wherein the count circuit is further configured to alter at least one of a period or phase of the output clock signal based at least in part on modifying a rollover rate of the count circuit.

In another embodiment, a frequency synthesizer comprises a count circuit configured to modify a stored count value by an adjustment value; and an output clock generator configured to generate an output clock signal having rising and falling edges that are based at least in part on the stored count value satisfying a count threshold, wherein the count circuit is further configured to alter at least one of a period or phase of the output clock signal based at least in part on modifying the count threshold of the count circuit.

In yet another embodiment, a method of synthesizing an output clock comprises modifying a count value, stored by a count circuit, by an adjustment value; generating an output clock signal having rising and falling edges that are based at least in part on the stored count value satisfying a count threshold; and altering at least one of a period or phase of the output clock signal via modifying the adjustment value of the count circuit.

BRIEF DESCRIPTION OF THE DRAWINGS

These drawings and the associated description herein are provided to illustrate specific embodiments and are not intended to be limiting.

DETAILED DESCRIPTION

Figure 1:
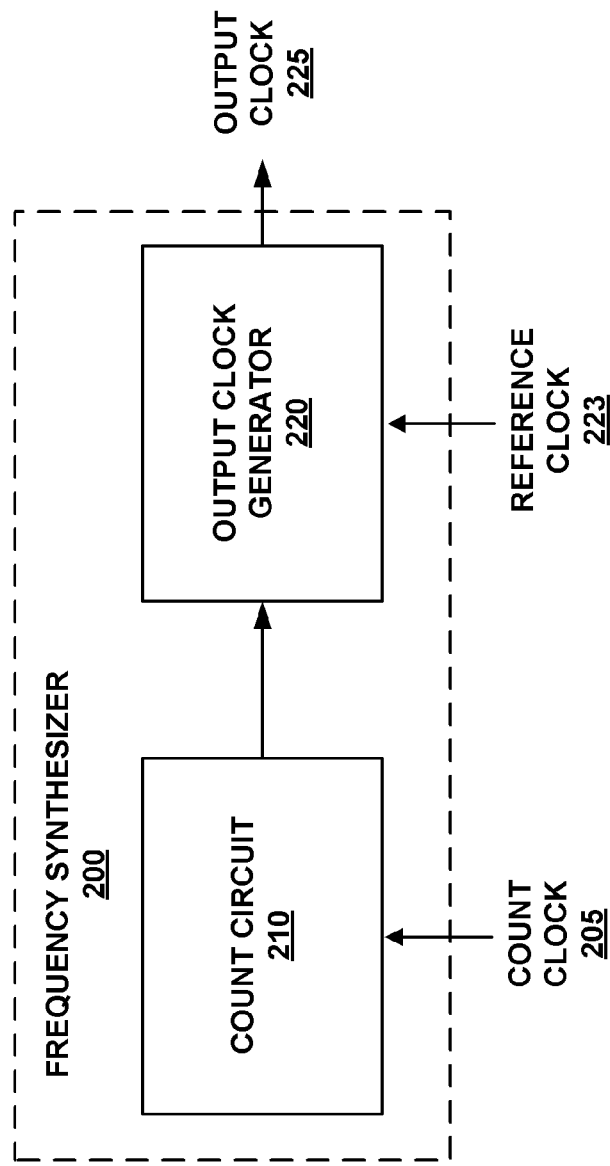
FIG. 1 is a block diagram illustrating a frequency synthesizer according to an embodiment.

The following detailed description of certain embodiments presents various descriptions of specific embodiments of the disclosure. However, other embodiments can be implemented in a multitude of different ways as defined and covered by the claims. In this description, reference is made to the drawings where like reference numerals can indicate identical or functionally similar elements. In the drawings, certain embodiments are illustrated with representative block diagrams. These block diagrams are simplified representations of the embodiments in which certain elements not directly related to the described embodiments are not illustrated.

One example of a frequency synthesizer is a direct digital synthesizer (DDS). DDSs are able to synthesize waveforms with fine control over the waveform's phase, frequency, and amplitude. A typical DDS includes a numerically controlled oscillator (NCO), a digital-to-analog converter (DAC), and a reconstruction filter. The NCO includes an accumulator and a phase-to-amplitude lookup table. Together, the phase-to-amplitude lookup table and DAC enable the DDS to convert a square wave input clock into an output wave form, for example, a sinusoidal wave, triangle wave, square wave, etc., via mapping the phase of the accumulator output into the correct amplitude of the selected output wave form.

DDSs generally include a relatively large amount of hardware to implement all of the relevant functionality. Specifically, the DAC and reconstruction filter can make up a large portion of the overall hardware of the DDS. Accordingly, DDSs are typically formed as an independent chip and it can be difficult to integrate a DDS as a portion of another chip.

For example, certain applications may only use an adjustable clock signal, but do not require the ability to output different wave forms, such as sinusoid waves. As such, the phase-to-amplitude converter, DAC, and reconstruction filter provide extraneous functionality in these applications and also take up a large hardware footprint.

FIG. 1 is a block diagram illustrating an embodiment of a frequency synthesizer 200. Embodiments of the described technology can preserve the agility offered by DDSs while having a reduced complexity and/or hardware footprint. In the illustrated embodiment of FIG. 1, the frequency synthesizer 200 includes a count circuit 210 and an output clock generator 220.

In the illustrated embodiment, the frequency synthesizer 200 receives a count clock 205, or count clock signal, and a reference clock 223 as inputs and outputs an output clock 225, or output clock signal. However, it will be understood that the frequency synthesizer 200 can include any number of inputs and/or outputs, as desired. For example, the frequency synthesizer 200 can receive as inputs one or more user selectable control inputs for controlling the generation of the output clock 225. Additionally, in some embodiments, the count clock 205 may be generated from within the synthesizer 210 instead of being received as a separate input.

In one example, the frequency synthesizer 200 generates the count clock 205 based on the reference clock 223. Accordingly, the count clock 205 and the reference clock 223 can be synchronized to each other. Thus, in some embodiments, the count clock 205 is related to and synchronous with the reference clock 223.

In some embodiments, the count circuit 210 receives the count clock 205 and adjusts a stored count value by an adjustment value. The adjustment value can be a positive or negative value and can be adjusted as desired. The count circuit 210 can adjust the stored count value at any desired rate. For example, in some embodiments, the count circuit 210 can adjust the stored count value by the adjustment value for each period of the count clock 205. However, in some embodiments, the count circuit 210 can adjust the stored count value at a fractional value of the period of the count clock 205 or the count circuit 210 can adjust the stored count value at a multiple number of periods of the count clock 205.

In certain embodiments, the count circuit 210 can compare the stored count value to a count threshold. In some embodiments, the count circuit 210 can compare the stored count value to a count threshold over time. For example, the count circuit 210 can compare the stored count value to the count threshold for each period of the count clock 205. It will be understood that the count circuit 210 can compare the stored count value to the count threshold at any desired interval, such as multiple times over each period of the count clock 205 or once every set of multiple periods of the count clock 205.

Based on a determination that the stored count value satisfies the count threshold, also known as a rollover event, the count circuit 210 can adjust the stored count value to a reset value, or rollover value. In some embodiments, the periodicity of this rollover event can be referred to as a rollover rate of the count circuit 210. In embodiments where the adjustment value is positive, the count threshold can be satisfied when the stored count value is greater than or equal to the count threshold. In some embodiments, the count circuit 210 can determine that the stored count value satisfies the count threshold based at least in part on a determination that the stored count value is within a predetermined range of the count threshold.

In addition, in some embodiments, the count circuit 210 can determine the reset value based on the stored count value and the count threshold. For example, in embodiments in which the adjustment value is positive, the reset value can be equal to the difference between the stored count value and the count threshold when the stored count value is greater than the count threshold.

Further, in embodiments in which the adjustment value is negative, the count threshold can be satisfied when the stored count value is less than or equal to zero. In these embodiments, the count circuit 210 can determine the reset value to be equal to the count threshold (which can be a positive initial value) or a value obtained by adding the count threshold to the stored count value when the count threshold is satisfied.

In some embodiments, the output clock generator 220 can generate an output clock 225 having the selected phase, frequency, pulse-width, and/or pattern. In certain embodiments, the output clock generator 220 can generate the output clock 225 based on the output received from the count circuit 210. For example, the output clock generator 220 can generate the output clock 225 based on the stored count value. In certain embodiments, the output clock generator 220 generates a transition, e.g., a rising edge or a falling edge, in the output clock 225 when the stored count value satisfies the count threshold. The output clock generator 220 can also use the reset value to determine the timing of the transition in the output clock 225. For example, the output clock generator 220 can receive a reference clock 223, which has a higher frequency than the count clock 205. In some embodiments, the output clock generator 220 or the count circuit 210 adjusts the timing of the transition in the output clock 225 by a number of transitions in the reference clock 223 equal to the reset value.

The frequency synthesizer 200 can adjust various properties of the output clock 225, such as the phase, frequency, and pulse-width of the output clock 225, by adjusting when the stored count value of the count circuit 210 satisfies the count threshold. For example, the frequency of the output clock 225 can be based on the frequency at which the count circuit 210 satisfies the count threshold, for example, at the rollover rate. Further, by changing the rollover rate for a period of time, the phase of the output clock 225 can be adjusted. The adjustment of the pulse-width of the output clock 225 will be described in greater detail below in connection with additional embodiments of the described technology.

Figure 2:
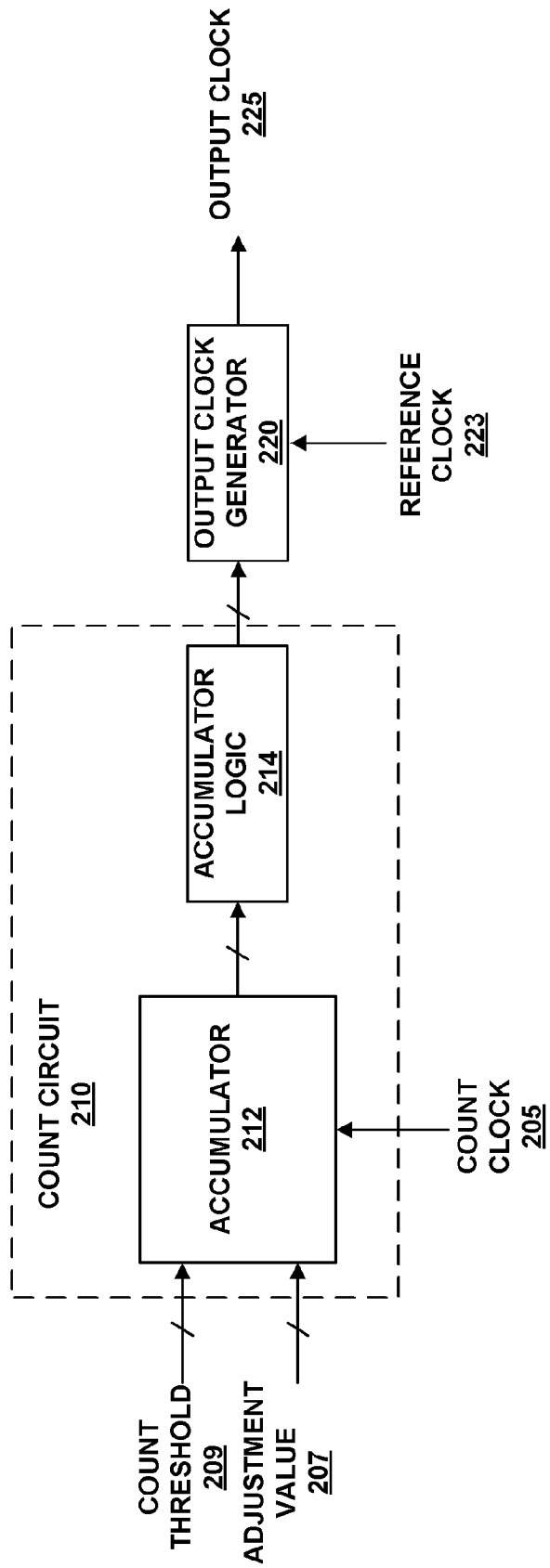
FIG. 2 is a block diagram illustrating an embodiment of a frequency synthesizer.

FIG. 2 is a block diagram illustrating an embodiment of the frequency synthesizer 200 in which the count circuit 210 is shown in greater detail. In the illustrated embodiment of FIG. 2, the count circuit 210 includes an accumulator 212 and accumulator logic 214. Further, in the illustrated embodiment of FIG. 2, the accumulator 212 receives a count threshold 209, which in some embodiments can be a modulus, an adjustment value 207, and a count clock 205 as inputs. However, it will be understood that in certain embodiments, one or more of the count threshold 209, the adjustment value 207, and an count clock 205 can be generated internally. In some embodiments, at least one of the count threshold 209, the adjustment value 207, and the count clock 205 is received from a source external to the frequency synthesizer 200. As discussed below, the frequency and/or phase of the output clock 225 can be adjusted based on the count threshold, adjustment value, and/or the count clock 205.

The accumulator logic 214 can translate the stored count value received from the accumulator 212 to a usable stream of data that the output clock generator 220 can process. In some embodiments, the accumulator logic 214 is implemented as logical circuitry including a plurality of electrical components such as logic gates. In one embodiment, the output clock generator 220 is a serializer which can transform the stream of data received from the accumulator logic 214 in parallel and output the output clock 225 in serial form. In one embodiment, the accumulator logic 214 can include a thermometer decoder.

The frequency synthesizer 200 can further include additional logic (not illustrated) surrounding the count circuit 210 that can alter the values of the count threshold 209, adjustment value 207, and/or count clock 205 so as to enable features such as phase control, frequency control, pulse-width modulation, and pattern generation. In certain implementations, the granularity of the phase and/or pulse-width control is a half-cycle of the reference clock 223. In some implementations, the granularity of the phase and/or pulse-width control can be the reference clock 223 cycle or a multiple of the reference clock 223 cycle. In other implementations, the granularity of the phase and/or pulse-width control can be another fraction of the reference clock 223 cycle, for example, a one eighth-cycle of the reference clock 223 cycle.

In the illustrated embodiment, the frequency of the output clock 225 can be determined by the rollover rate of the accumulator 212. In some embodiments, the user-input controlling the rollover rate of the frequency synthesizer 200 can be a modulus (one example of a count threshold 209). In certain implementations, the adjustment value 207 is proportional to the bit-width of the output clock generator 220. That is, in some embodiments, the output clock generator 220 is a phase interpolator 220 and the adjustment value 207 is referred to as an interpolation-ratio. For example, an 8-bit phase interpolator 220 can process a single 8-bit interpolator word at a time and thus the accumulator 212 can increment its count by 8 every count clock 205 cycle. However, in some embodiments, the adjustment value is not proportional to the bit-width of the phase interpolator 220. In these embodiments, the accumulator logic 214 can format the accumulator 212 output via, for example, a buffer or other logic components included in the accumulator logic 214 in order to transform the accumulator 212 output into a format that can be used by the phase interpolator 220. In some embodiments, the user-input controlling the rollover rate can control the value of the adjustment value 207. In these embodiments, the adjustment value 207 can be adjusted for a set period of time in order to shift the phase of the output clock 225. In alternate embodiments, the user-input controlling the rollover rate can control the accumulator's 212 response to the count clock 205. For example, the accumulator can skip one cycle of the count clock 205 in order to delay the accumulator rollover.

The accumulator logic 214 can detect when the count threshold is satisfied (which can also referred to as a rollover event) in the accumulator 212 and generate an indication of the timing of a transition in the output clock 225 via the accumulator logic 214 output. In some embodiments, the accumulator logic 214 outputs a plurality of bits (which can also be referred to as an output word) at a rate corresponding to the period of the count clock 205. When the output clock generator 220 is embodied as a phase interpolator 220, the output words can be referred to as interpolator words. The transitions in the logical values of the interpolator words can indicate the correct placement of rising and/or falling edges of the synthesized output clock 225.

Figure 8:
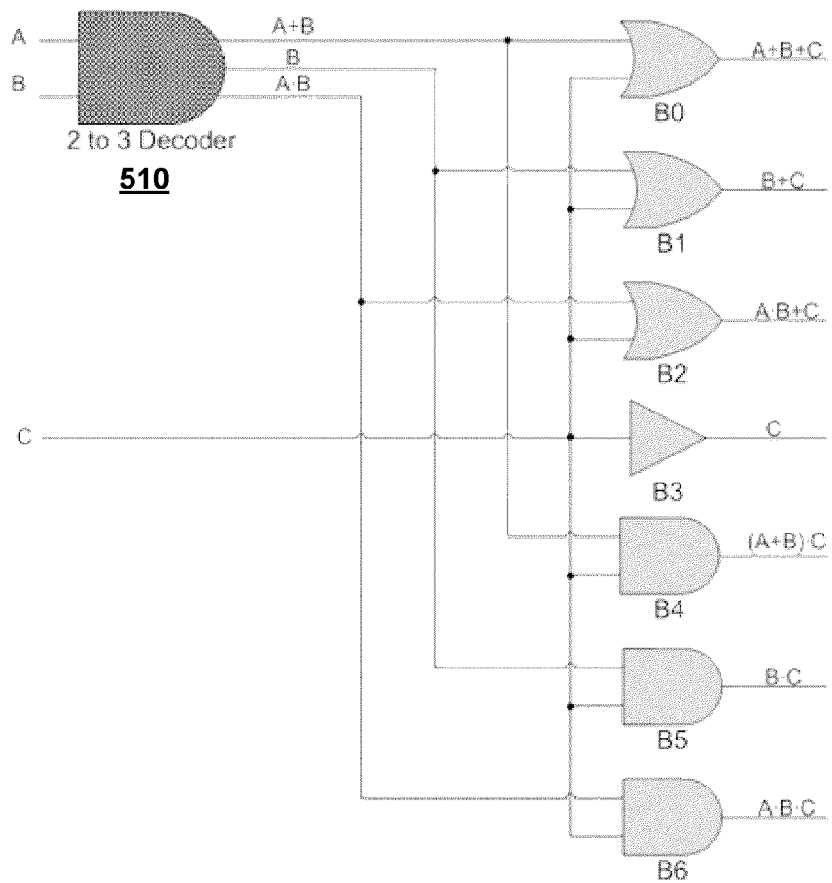
FIG. 8 is a diagram illustrating a thermometer decoder according to an embodiment.

In some embodiments, the accumulator logic 214 can further include a thermometer decoder (see FIG. 8). Based at least in part on the occurrence of a rollover event, the accumulator logic 214 can process the residue of the accumulator 212 through the thermometer decoder, and the thermometer decoder generates the interpolator words that are output to the phase interpolator 220. Depending on the embodiment, the residue can be the difference between the count threshold 209 and the stored count value when the count threshold 209 is satisfied or another value indicative of the timing of a transition in the output clock 225 when the count threshold 209 is satisfied. Based at least in part on the indication of a transition, such as, a rising or falling edge, being processed by the accumulator logic 214, the polarity of the thermometer decoder output bits can be toggled so that the next transition processed through the thermometer decoder corresponds to the opposite edge, such as, a falling or rising edge. In certain embodiments, the size of the thermometer decoder matches the bit-width of the phase interpolator 220. For example, a 3-to-7 decoder plus a static low most significant bit (MSB) would be used with an 8-bit phase interpolator 220.

As discussed above, in exemplary embodiments, count circuit 210 can be configured to modify the count threshold 209 of the accumulator 212 in order to control the phase or frequency of the synthesized output clock 225. For example, the phase of the output clock 225 can be adjusted by increasing or decreasing the rollover rate of the accumulator 212 for a predetermined number of rollover cycles (for example, a rollover cycle can refer to the period of time between two count thresholds 209 being satisfied). Since a change in the count threshold can affect when the accumulator 212 rolls over and/or the reset value of the rollover event (also be referred to as a residue value) the accumulator 212 can adjust the position of the indication of the next transition in the interpolator words output to the phase interpolator 220. The amount by which the count threshold 209 is increased or decreased can determine the amount of time it takes to slew from one phase to another. In certain embodiments, the frequency synthesizer 200 further includes a phase control module (not illustrated), which can include a counter that maintains a tally of the accumulator's 212 rollover cycles while phase slewing is taking place and gating logic to modify the count threshold 209 as a function of a user-defined phase-step. That is, a user can determine the rate at which the phase slewing occurs when transitioning between different phases in the output clock 225.

Figure 3:
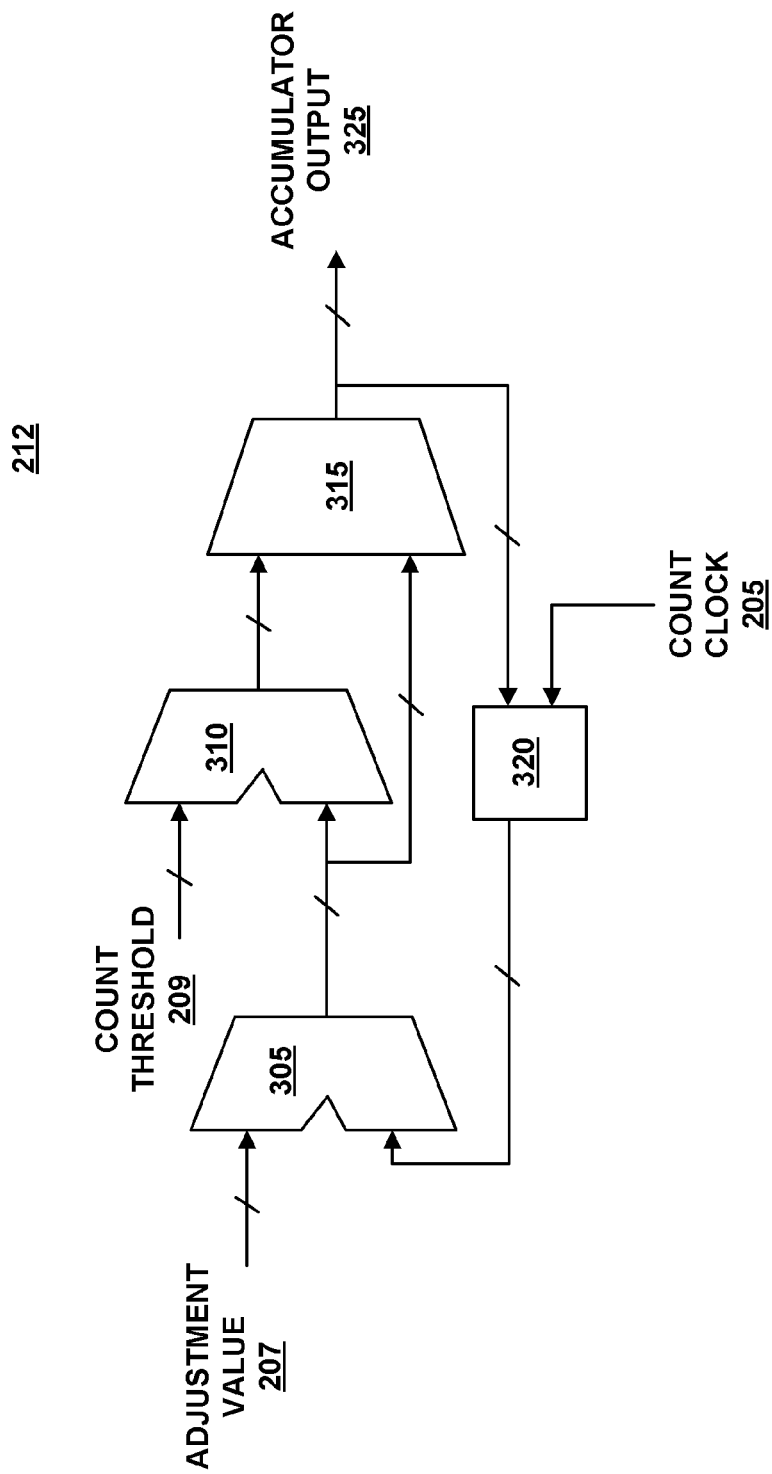
FIG. 3 is a block diagram illustrating an accumulator according to an embodiment.

FIG. 3 is a block diagram illustrating an accumulator according to an embodiment. In the FIG. 3 embodiment, the accumulator 212 includes an adder 305, a subtractor 310, a multiplexer 315, and a memory 320.

The adder 305 receives the adjustment value 207 and the previously stored count value. The adjustment value 207 can be received from an external source or can be a fixed value. The adder 305 can add the adjustment value 207 to the previously stored count value in order to increment the previously stored count value by the adjustment value 207. However, depending on the embodiment, the adder 305 can be implemented as a subtractor in order to decrement the stored count value. In some embodiments, the count value can be adjusted via other mathematical operations, such as multiplication or division. In these embodiments, the adder 305 can be implemented as a multiplier or divider.

The subtractor 310 subtracts the count threshold 209 from the result received from the first adder 305. Accordingly, when the incremented stored count value is greater than the count threshold 209, the result from the subtractor 310 can be used as the residue value. In embodiments where the adder 305 is implemented as a subtractor, the subtractor 310 can be implemented as an adder and further components can be added to determine the residue value. The multiplexer 315 selects one of the outputs from the adder 305 and the subtractor 310 as the accumulator output 325. For example, when the incremented stored count value is less than the count threshold 209, the multiplexer 315 selects the output from the adder 305 and when the incremented stored count value is greater than or equal to the count threshold 209, the multiplexer 315 selects the output from the subtractor 310. Thus, when the multiplexer 315 selects the residue value from the subtractor 310, the residue value can be used as the reset value to adjust the stored count value.

The memory 320 can store the stored count value, and can be implemented as a flip-flop or latch, or other memory device, and/or can be clocked by the count clock 205, as desired. In some embodiments, once for each period of the count clock 205 (or other interval as desired), the memory 320 can update the stored count value to the value output from the multiplexer 315. Accordingly, the stored count value can be adjusted by the adjustment value until the stored count value satisfies the count threshold (for example, is greater than or equal to the count threshold, is within a threshold difference of the count threshold, or is less than the count threshold). Once the stored count value satisfies the count threshold, the stored count value can roll over and/or be adjusted to the residue value or reset value. For example, after the stored count value rolls over, the residue value can be stored as the stored count value.

Figure 4:
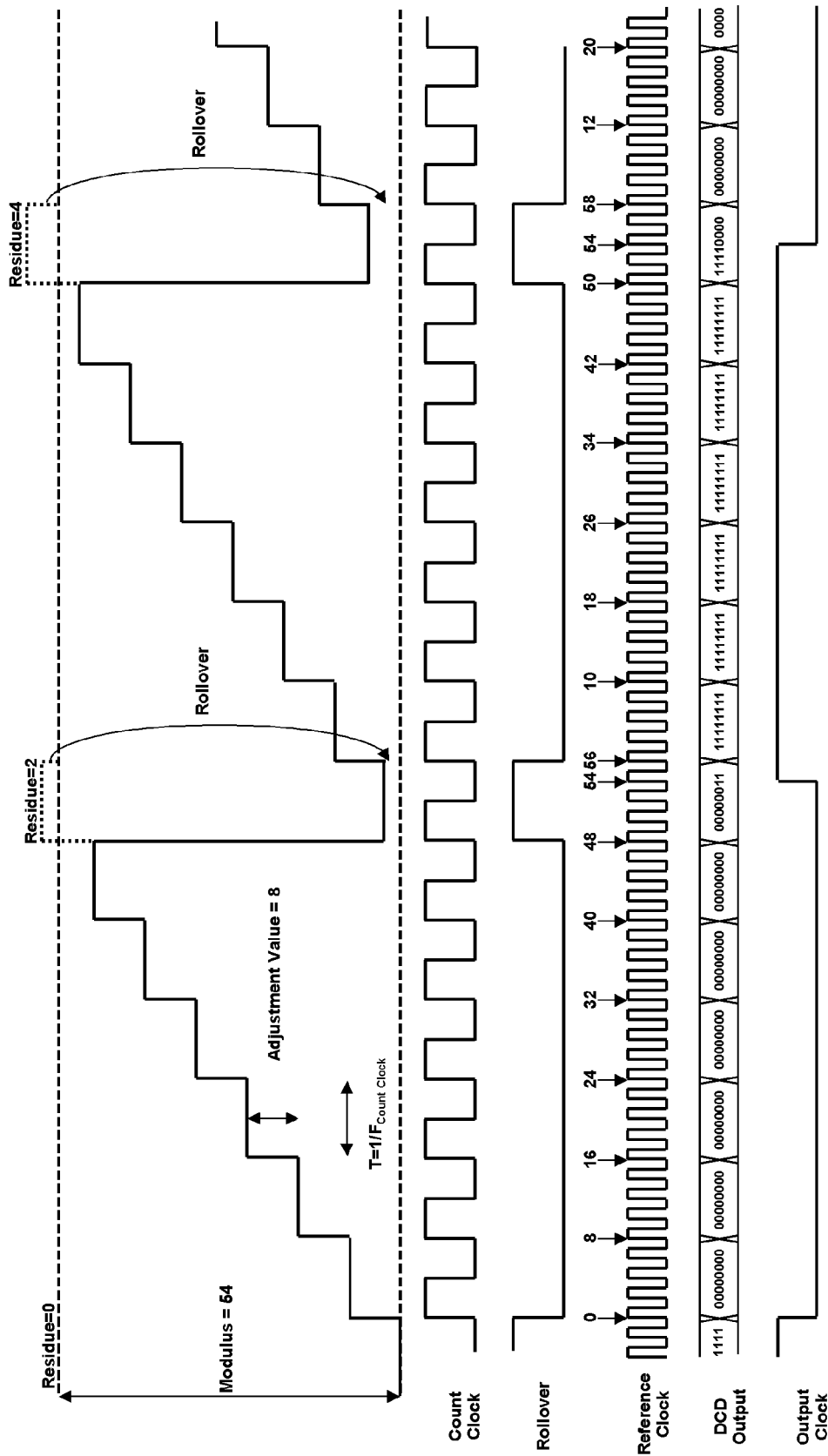
FIG. 4 is a timing graph illustrating a stored count value stored in an accumulator and the corresponding output clock according to an embodiment.

FIG. 4 is a timing graph illustrating a stored count value stored in an accumulator and the corresponding output clock according to an embodiment. FIG. 4 illustrates an embodiment where the count threshold 209 of the accumulator 212 is set to 54. However, as discussed above, the count threshold 209 can be variously set and can be adjusted to change the phase and/or frequency of the output clock 225. In the illustrated embodiment, the stored count value of the accumulator 212 is incremented by an adjustment value of 8. However, it will be understood that any adjustment value can be used as desired. When the stored count value is adjusted to the reset value, such as, for example, when the accumulator rolls over, the stored count value can be set to the residue of the rollover event (for example, the stored count value satisfying the count threshold). In the first rollover event illustrated in FIG. 4, the residue is 2, which is then set as the new value of the stored count value after the rollover event.

In the illustrated embodiment, after the rollover event, the accumulator logic 214 generates an indication of the output clock 225 transition in a thermometer decoder output (illustrated as DCD output in FIG. 4). The output clock generator 220 then generates the output clock 225 having the indicated transition based on the accumulator logic 214 output. When the DCD output, e.g., the bits of the interpolator words, are output in parallel, the output clock generator 220 can serialize the interpolator words (for example, translate the output words from a parallel format to a sequential format) to generate the output clock 225. A transition in the bits of the interpolator words, such as from 0 to 1 or from 1 to 0, indicates a corresponding transition in the output clock 225. Thus, the output clock generator 220 can select a transition in the reference clock 223 based on the transition in the bits of the interpolator words as the timing for a corresponding transition in the output clock 225.

In some embodiments, the residue indicates the number of transitions in the reference clock 223 that can be used to adjust the timing of the transitions in the output clock 225. For example, in the first rollover event illustrated in the FIG. 4 embodiment, there is a residue of 2. The accumulator logic 213 and the output clock generator 220 process the rollover event using the residue to determine the timing of the transition in the output clock 225. In the illustrated example, after the stored count value has been adjusted to the residue of 2, the accumulator logic 213 and/or the output clock generator 220 indicate a transition in the output clock 225 as occurring two transitions earlier in the reference clock 223. For example, at the transition indicated by the number 56 in the reference clock 223 of FIG. 4, the stored count value is adjusted to the residue of 2. This residue value is used to count 2 transitions back in the reference clock 223, as indicated by the number 54 in the reference clock 223. The output clock generator 220 and the accumulator logic 213 generate the transition in the output clock 225 based on this transition in the reference clock 223 and shown by the DCD output line and the output clock 225.

Figure 5:
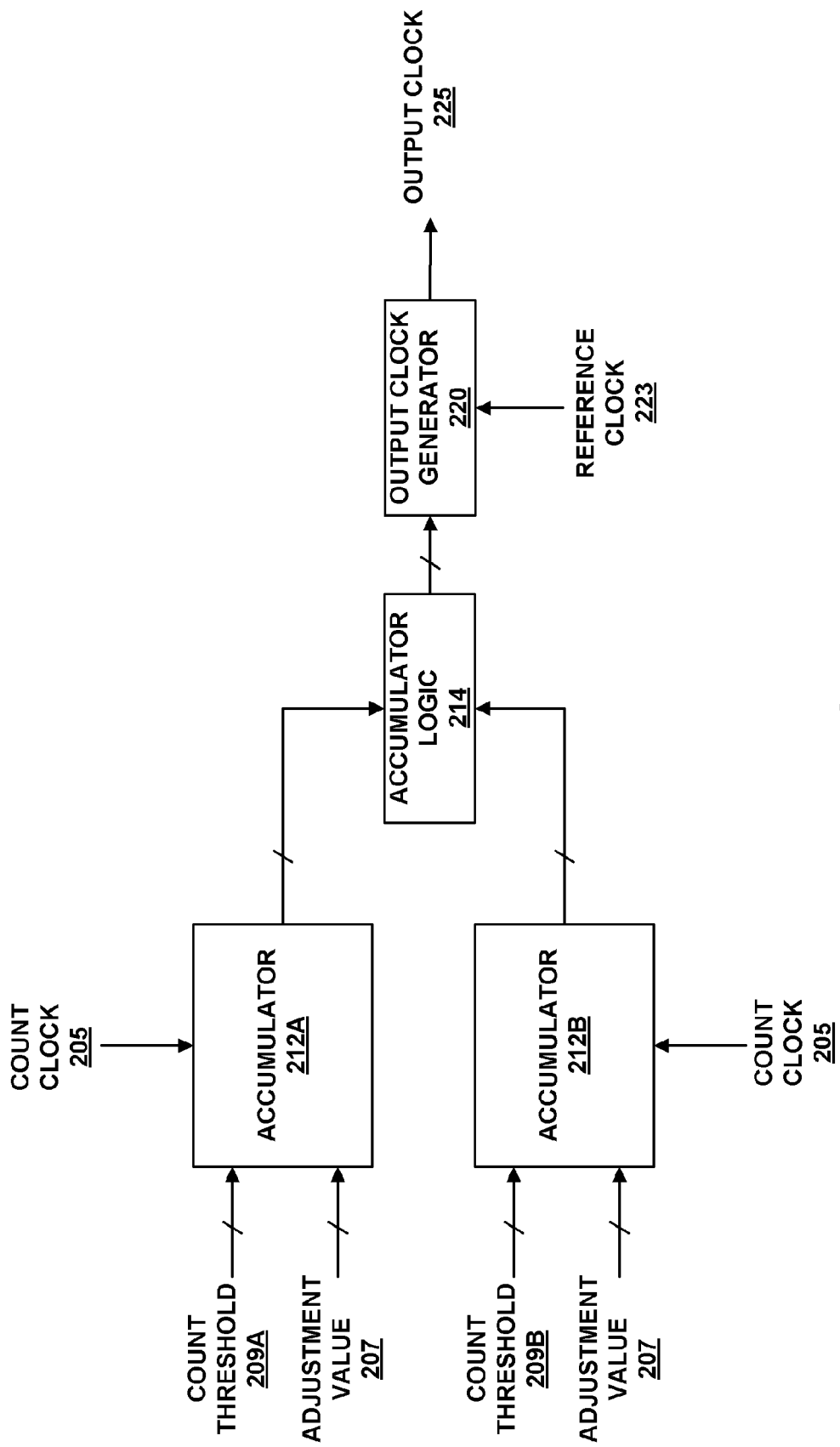
FIG. 5 is a block diagram illustrating another embodiment of a frequency synthesizer.

FIG. 5 is a block diagram illustrating another embodiment of a frequency synthesizer. The FIG. 5 embodiment includes first and second accumulators 212A and 212B, accumulator logic 214 and an output clock generator 220. In other embodiments, three or more accumulators 212 can be included in the frequency synthesizer 200. Each of the first and second accumulators 212A and 212B can receive an count clock 205, an adjustment value 207, and one of a first and second count threshold 209A and 209B. However, in some embodiments, the first and second accumulators 212A and 212B can receive different count clocks 205 and/or different adjustment values 207.

Each of the first and second accumulators 212A and 212B can have an internal structure that is similar to the embodiment shown in FIG. 3. The accumulator logic 214 can receive the output from each of the first and second accumulators 212A and 212B and process the outputs such that the output clock generator 220 can generate the output clock 225. In some embodiments, the accumulator logic 214 includes first and second thermometer decoders (not illustrated) corresponding to the first and second accumulators 212A and 212B. The outputs from each of the first and second thermometer decoders can be combined before being output to the output clock generator 220. For example, the outputs from the first and second thermometer decoders can be combined via an exclusive OR (XOR) logical operation or an OR logical operation.

Figure 6:
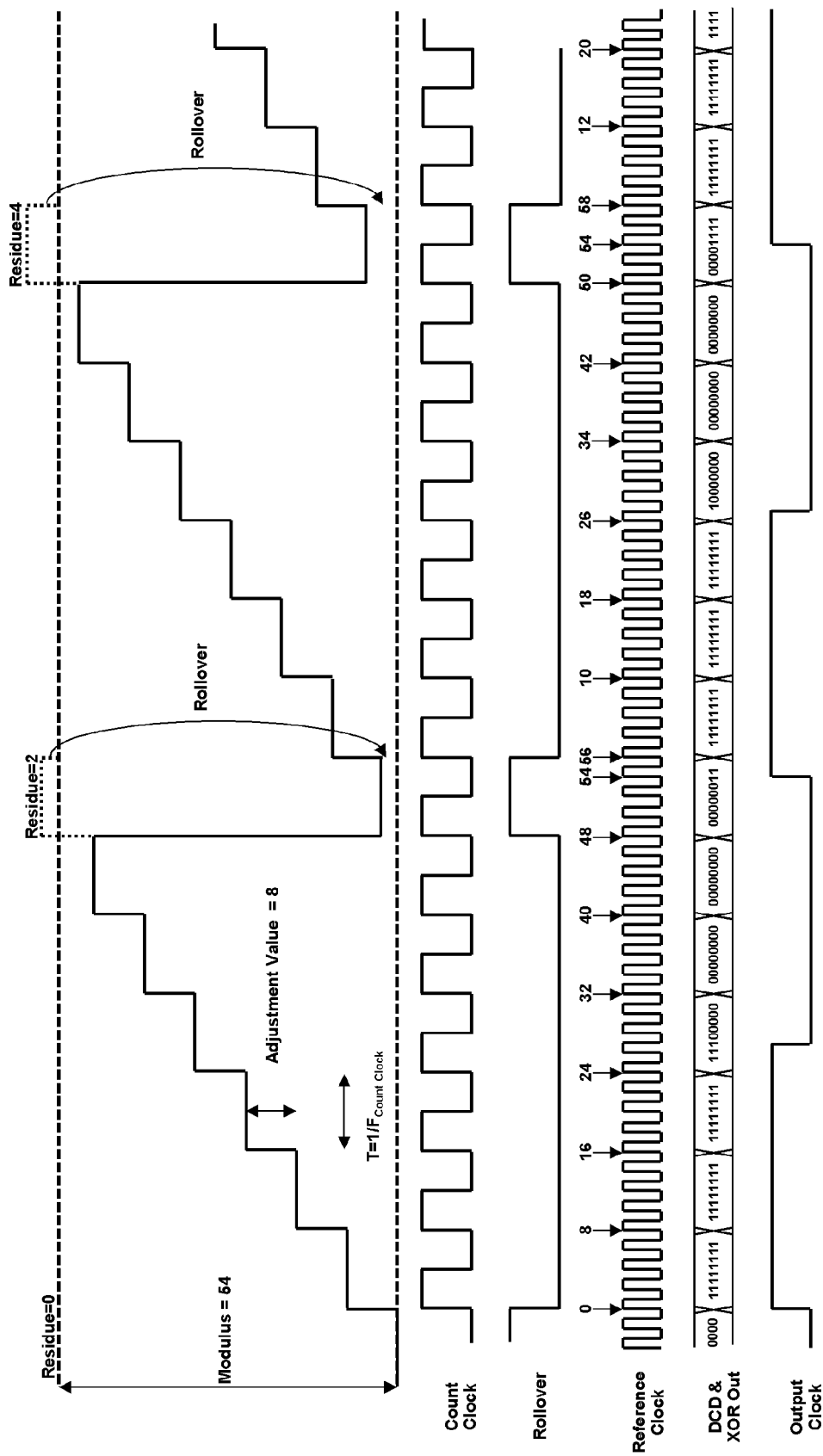
FIG. 6 is a timing graph illustrating a stored count value stored in an accumulator and the corresponding output clock according to an embodiment.

FIG. 6 is a timing graph illustrating a stored count value stored in the accumulator and the corresponding output clock according to an embodiment. Specifically, FIG. 6 illustrates an embodiment including two accumulators such as the first and second accumulators 212A and B of FIG. 5 in order to enable pulse-width modulation of the output clock.

In the illustrated embodiment of FIG. 6, the thermometer decoder outputs can be combined via XOR logic to produce the DCD & XOR. However, in other embodiments, the output from each of the first and second accumulators 212A and 212B can be mixed and/or interleaved via the accumulator logic 214 in order to produce the DCD & XOR Out line. In some embodiments, the use of XOR logic can enable a plurality of transitions to be indicated via a single interpolator word. The number of transitions per interpolator word can depend on the number of accumulators 212 included in the frequency synthesizer 200. One of the accumulators 212, for example, the first accumulator 212A, can indicate a rising transition in the output clock 225 and the other accumulator 212, for example, the second accumulator 212B, can indicate a falling transition in the output clock 225. Each of the first and second accumulators 212A and 212B can be controlled independently.

In some embodiments, the first and second accumulators 212A and 212B can have a rollover rate of half the output clock 225 frequency and can be initially seeded to be 90 degrees offset from each other or can be initially seeded to any other offset including 0 degrees. For example, when the count threshold is set to a value of 54 as shown in FIG. 6, the first accumulator 212A can be seeded to an initial stored count value of 0 and the second accumulator 212B can be seeded to an initial stored count value of 27. The respective thermometer decoder outputs from each of the first and second accumulators 212A and 212B are subsequently mixed together via the XOR logic before being delivered to the output clock generator 220. The first and second accumulators 212A and 212B are driven by independent phase-control modules (not illustrated), the pulse-width can be modulated by varying the phase of the falling-edge or rising-edge of the corresponding one of the first and second accumulator 212A and 212B. For example, by altering the phase of the second accumulator 212B with respect to the phase of the first accumulator, the pulse-width can be increased or decreased. The phase of the first accumulator 212A can also be altered to adjust the pulse-width or the phases of both the first and second accumulators 212a and 212B can be simultaneously modified.

In further embodiments, the output clock 225 can be manipulated to generate gapped-periodic, on-demand n-shot, and pseudo-random outputs by detecting the rollover events and gating the decoded phase interpolator words. This can allow for support of clocking requirements for chip-to-chip data link synchronization standards. One skilled in the art will appreciate the adjustments to the accumulator logic 214 required to generate the variations in the output clock 225 based on the one or more accumulators 212 of the count circuit 210.

Figure 7:
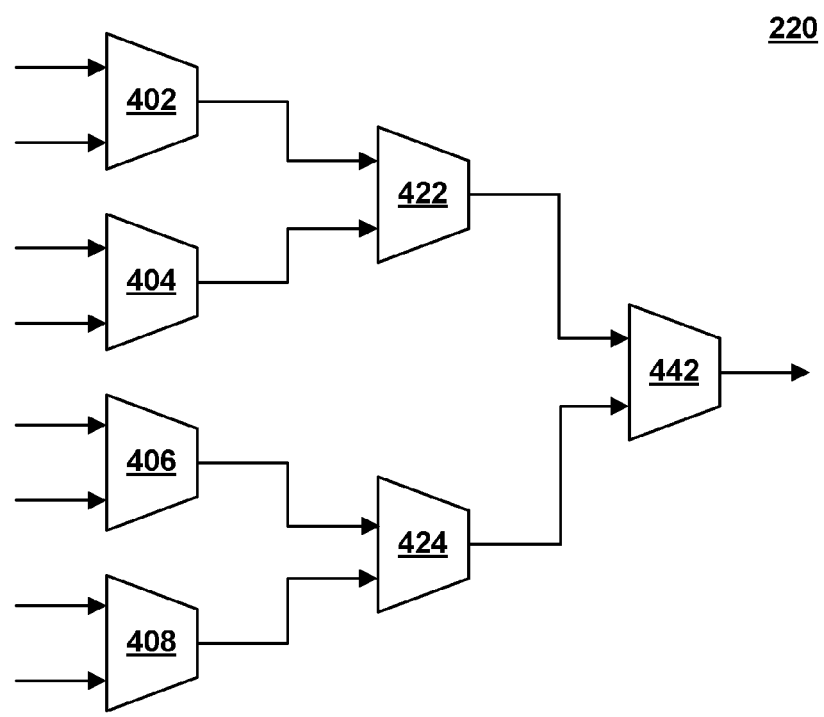
FIG. 7 is a diagram illustrating an output clock generator according to an embodiment.

FIG. 7 is a diagram illustrating an output clock generator according to an embodiment. In the illustrated embodiment of FIG. 7, the output clock generator 220 includes a plurality of multiplexers 402 to 442. The illustrated embodiment shows the output clock generator 220 implemented as a serializer. The first level of multiplexers 402, 404, 406, and 408 receive the bits of each of the interpolator words. Thus, in the FIG. 7 embodiment, the interpolator words are 8-bit words. The second and third levels include the multiplexers 422, 424, and 442. The serializer can sequentially select the bits of the interpolator words to generate the output clock 225. Further, although the clocks controlling the selection of the multiplexers 402 to 442 are not illustrated, the first level including the multiplexers 402 to 408 can be clocked at a first frequency, the second level including the multiplexers 422 and 424 can be clocked at a second frequency that is twice that of the first frequency, and the third level including the multiplexer 442 can be clocked at a third frequency that is twice that of the second frequency. In some embodiments, the output clock generator 220 includes fewer or more multiplexers 402 to 442 than the embodiment of FIG. 7. This can required additional rows of multiplexers including for example, rows of 8 and 16 multiplexers. However, in some embodiments, each multiplexer can have more than 2 inputs and thus, the output clock generator 220 can be implemented with fewer rows of multiplexers.

FIG. 8 is a diagram illustrating a thermometer decoder according to an embodiment. In the illustrated embodiment of FIG. 8, the thermometer decoder 500 includes a 2 to 3 decoder 510 and a plurality of logic gates B1 to B6. The logic gates can include a plurality of logic OR gates B0, B1, and B2; a buffer gate B3; and a plurality of logic AND gates B4, B5, and B6. The thermometer decoder can receive three inputs, A, B, and C and generate a plurality of outputs based on the inputs A, B, and C. However, the thermometer decoder 500 illustrated in FIG. 7 is merely an example and any other thermometer decoder can be used in the count circuit 210.

Although various features and components have been described in terms of certain embodiments, other embodiments that are apparent to those of ordinary skill in the art, including embodiments that do not provide all of the features and advantages set forth herein, are also within the scope of the disclosure. Moreover, the various embodiments described above can be combined to provide further embodiments. In addition, certain features shown in the context of one embodiment can be incorporated into other embodiments as well. Accordingly, the scope of the disclosure is defined only by reference to the appended claims.

Furthermore, as used in the claims, language such as the phrase "at least one of X, Y and Z," and/or "at least one of X, Y or Z," are understood to convey that an item, term, recitation, claim element, etc. may be any of X, Y, or Z, or any combination thereof (non-limiting examples: XY, XZ, YZ, XYZ, etc.). Thus, such language is not generally intended to imply that certain embodiments require at least one of X, at least one of Y and at least one of Z to each be present or to require only one of: X or Y or Z, to the exclusion of others.

Moreover, the foregoing description and claims can refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components can be present in an actual embodiment (assuming that the functionality of the depicted circuits is not adversely affected).

What is claimed is:

1. A frequency synthesizer, comprising:
   a count circuit configured to adjust a stored count value by an adjustment value based at least in part on a count clock signal and adjust the stored count value to a reset value based at least in part on the stored count value satisfying a count threshold, wherein the reset value corresponds to a difference between the stored count value and the count threshold in response to the stored count value satisfying the count threshold; and
   an output clock generator configured to generate an output clock signal having rising and falling edges that are based at least in part on the reset value,
   wherein the count circuit is further configured to alter at least one of a period or phase of the output clock signal based at least in part on modifying a rollover rate of the count circuit.

2. The frequency synthesizer of claim 1, wherein modifying the rollover rate comprises modifying the count threshold.

3. The frequency synthesizer of claim 1, wherein the count circuit is further configured to determine the reset value in response to the stored count value exceeding the count threshold.

4. The frequency synthesizer of claim 1, wherein the count circuit comprises:
   accumulator logic configured to generate a plurality of output words that identify a timing of the rising and falling edges in the output clock signal.

5. The frequency synthesizer of claim 4, wherein the output clock generator is further configured to:
   receive a reference clock, the reference clock having a higher frequency than the count clock signal input to the count circuit;
   select a transition in the reference clock based at least in part on the output words; and
   generate a rising or falling edge in the output clock signal based at least in part on the timing of the selected transition in the reference clock.

6. The frequency synthesizer of claim 1, wherein the count circuit is a first count circuit, the stored count value is a first stored count value, the adjustment value is a first adjustment value, the reset value is a first reset value, the count threshold is a first count threshold, and the rollover rate is a first rollover rate and wherein the frequency synthesizer further comprises:
   a second count circuit configured to adjust a second stored count value by a second adjustment value based at least in part on the count clock signal and adjust the second stored count value to a second reset value based at least in part on the second stored count value satisfying a second count threshold, wherein the second reset value corresponds to a difference between the second stored count value and the second count threshold in response to the second stored count value satisfying the second count threshold, wherein the output clock generator is further configured to generate the output clock signal having rising and falling edges that are based at least in part on the second reset value, and wherein a timing of a second rollover rate of the second count circuit is offset from that of the count circuit.

7. The frequency synthesizer of claim 6, wherein the count circuit is further configured to generate a plurality of output words via a logical exclusive OR of the first and second stored count values, wherein the output clock generator is further configured to generate the output clock signal based at least in part on the output words.

8. The frequency synthesizer of claim 1, wherein the count circuit is further configured to generate a plurality of output words based on the stored count value, wherein the output clock generator further comprises a phase interpolator configured to reorganize the output words into sequential order, the output clock generator further configured to generate the rising and falling edges in the output words based at least in part on the reorganized output words.

9. The frequency synthesizer of claim 8, wherein the count circuit is further configured to generate at least one of gapped-periodic, on-demand n-shot, or pseudo-random signals in the output clock signal based at least in part on the output words.

10. The frequency synthesizer of claim 6, wherein the first and second count circuits are further configured to alter a pulse-width of the output clock signal based at least in part on modifying the first and second rollover rates.

11. A frequency synthesizer, comprising:
a count circuit configured to modify a stored count value by an adjustment value; and
an output clock generator configured to generate an output clock signal having rising and falling edges that are based at least in part on the stored count value satisfying a count threshold,
wherein the count circuit is further configured to alter at least one of a period or phase of the output clock signal based at least in part on dynamically modifying the count threshold of the count circuit.

12. The frequency synthesizer of claim 11, wherein the adjustment value is a positive and fixed value, the count circuit further being configured to reset the stored count value when the count threshold is satisfied, the count threshold being satisfied in response to the stored count value being greater than the count threshold.

13. The frequency synthesizer of claim 12, wherein the count circuit is further configured to:
determine a reset value based at least in part on a difference between the stored count value and the count threshold in response to the count threshold being satisfied; and
reset the stored count value to the reset value in response to the count threshold being satisfied.

14. The frequency synthesizer of claim 11, wherein the count circuit comprises:
an accumulator configured to: i) receive a count clock and ii) increment the stored count value for each period of the count clock; and
an accumulator logic circuit configured to generate a plurality of output words that identify a timing of the rising and falling edges in the output clock signal.

15. The frequency synthesizer of claim 14, wherein the output clock generator is further configured to:
receive a reference clock, the reference clock having a higher frequency than the count clock;
select a transition in the reference clock based at least in part on the output words; and
generate the rising and falling edges in the output clock signal based at least in part on the timing of the selected transition in the reference clock.

16. The frequency synthesizer of claim 11, wherein the count circuit is a first count circuit, the stored count value is a first stored count value, the adjustment value is a first adjustment value, the count threshold is a first count threshold, and wherein the frequency synthesizer further comprises:
a second count circuit configured to modify a second stored count value by a second adjustment value,
wherein the output clock generator is further configured to generate the output clock signal having rising and falling edges that are based at least in part on the second stored count value satisfying a second count threshold.

17. A method of synthesizing an output clock signal, comprising:
modifying a count value, stored by a count circuit, by an adjustment value;
generating an output clock signal having rising and falling edges that are based at least in part on the stored count value satisfying a count threshold; and
altering at least one of a period or phase of the output clock signal via dynamically modifying the count threshold of the count circuit.

18. The method of claim 17, wherein altering at least one of a period or phase of the output clock signal further comprises modifying the adjustment value.

19. The method of claim 17, wherein the adjustment value is a positive and fixed value, the method further comprising resetting the stored count value in response to the count threshold being satisfied, the count threshold being satisfied when the stored count value is greater than the count threshold.

20. The method of claim 19, further comprising:
determining a reset value based at least in part on a difference between the stored count value and the count threshold in response to the count threshold being satisfied; and
resetting the stored count value to the reset value in response to the count threshold being satisfied.

* * * * *